United States Patent
Frankowsky

(10) Patent No.: US 6,734,474 B2
(45) Date of Patent: May 11, 2004

(54) INTEGRATED SEMICONDUCTOR CIRCUIT HAVING CONTACT POINTS AND CONFIGURATION HAVING AT LEAST TWO SUCH CIRCUITS

(75) Inventor: Gerd Frankowsky, Höhenkirchen-Siegertsbrunn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/200,933

(22) Filed: Jul. 23, 2002

(65) Prior Publication Data

US 2003/0015734 A1 Jan. 23, 2003

(30) Foreign Application Priority Data

Jul. 23, 2001 (DE) .......................... 101 35 812

(51) Int. Cl.⁷ .......................... H01L 27/10; H01L 23/02
(52) U.S. Cl. ..................... 257/209; 257/685; 257/686; 361/626; 361/628; 361/629; 361/630; 361/837
(58) Field of Search ................ 257/209, 685, 257/686, 207, 208, 211, 529, 530; 438/109, 128, 129; 361/626, 628, 629, 630, 837, 833; 365/96, 189.11, 255.7; 327/525

(56) References Cited

U.S. PATENT DOCUMENTS

2003/0008432 A1 * 1/2003 Kux et al. .................. 438/106

* cited by examiner

Primary Examiner—Minhloan Tran
Assistant Examiner—Tan Tran
(74) Attorney, Agent, or Firm—Laurence A. Greenberg; Werner H. Stemer; Ralph E. Locher

(57) ABSTRACT

For a selection of semiconductor chips stacked on top of one another, the invention includes leading through selection contact points of one chip on a rear side thereof and connecting them to corresponding selection contact points of the other semiconductor chip. Programmable input amplifiers are programmed to be transmissive or blocking through fuses/antifuses so that selection signals applied to the selection contact points either activate or block functional elements only of one or only of the other semiconductor chip. As a result, simple stacking of identically prefabricated semiconductor chips is made possible.

20 Claims, 2 Drawing Sheets

INTEGRATED SEMICONDUCTOR CIRCUIT HAVING CONTACT POINTS AND CONFIGURATION HAVING AT LEAST TWO SUCH CIRCUITS

BACKGROUND OF THE INVENTION

FIELD OF THE INVENTION

The invention relates to an integrated semiconductor circuit including a substrate body, on whose first main area are disposed a multiplicity of contact points for feeding signals to be processed, to which functional elements are connected in each case. The invention additionally relates to a configuration including at least two such integrated semiconductor circuits that are connected to one another.

Endeavors are made to combine integrated semiconductor circuits into modules. From semiconductor memories, in particular, memory modules are formed by stacking individual memory chips one above the other. In such a case, it is necessary to individually address individual memory chips within a memory module.

For such a purpose, by way of example, the semiconductor chips are provided with contact points, so-called connection pads, on the front side and on the rear side. A connection led through the substrate body of the semiconductor chip couples the connection pads on the front side to those on the rear side. Finally, mutually opposite connection pads on the rear side of one of the chips are contact-connected to corresponding connection pads on the front side of the other of the chips. What is problematic in this case is addressing individual chips individually within a module.

Existing in the prior art is provision of a rewiring plane between these stacked semiconductor chips. As a result, such a contact point that is provided for receiving a selection signal for one of the chips is connected to a line in the rewiring plane that, for its part, is led out laterally from the stack of semiconductor chips. From there, the line can be led along the outside of the chip stack to a contact point on an accessible surface of the stack. The assigned semiconductor chip is activated or deactivated by the application of a selection signal to the accessible contact point at the surface of the chip stack. However, the insertion of the rewiring plane between the semiconductor chips of a chip stack is laborious and complicated.

SUMMARY OF THE INVENTION

It is accordingly an object of the invention to provide an integrated semiconductor circuit having contact points and configuration having at least two such circuits that overcome the hereinafore-mentioned disadvantages of the heretofore-known devices of this general type and that makes the semiconductor chip more suitable for stacking.

With the foregoing and other objects in view, there is provided, in accordance with the invention, an integrated semiconductor circuit, including a substrate body having a first main area and a second main area opposite the first main area, first contact points for feeding signals to be processed, the first contact points disposed at the first main area, functional elements disposed in the substrate body, a respective one of the functional elements being connected to a respective one of the first contact points, programmable switching elements each having an output side and a programming, a respective one of the programmable switching elements either forwarding or blocking an externally fed selection signal dependent upon the programming of the respective one of the programmable switching elements, at least two second contact points each respectively connected to one of the programmable switching elements, further contact points disposed at the second main area, one of the further contact points being connected to a respective one of the first and the second contact points, at least one coupling node for conveying an internal selection signal, the output side of the programmable switching elements being coupled to the at least one coupling node and being connected to the functional elements, and the functional elements being controllable dependent upon the internal selection signal present at the at least one coupling node.

With the objects of the invention in view, there is also provided an integrated semiconductor circuit, including a substrate body having a first main area and a second main area opposite the first main area, contact points for feeding signals to be processed, the contact points disposed at the first main area, functional elements disposed in the substrate body, a respective one of the functional elements being connected to a respective one of the contact points, further contact points disposed at the second main area, the further contact points and the contact points connected to one another, programmable switching elements each having an output side and a programming, at least two of the contact points respectively connected to one of the programmable switching elements, the programmable switching elements either forwarding or blocking an externally fed selection signal at the at least two of the contact points dependent upon the programming of the programmable switching elements, and the programmable switching elements being coupled at the output side and generating an internal selection signal at the output side, a control of the functional element being dependent upon the internal selection signal.

In the case of a semiconductor chip or semiconductor circuit according to the invention, at least two selection contact points or selection pads are provided that are coupled to respective programmable switching elements. The programmable switching elements are preset or programmed such that they are either transmissive or blocked for a signal input externally. As in the prior art, connection pads are provided on the front side and the rear side of a chip, and are connected to one another. During the stacking of the semiconductor chips, the relevant connection pads are connected in parallel with one another. Through suitable programming of the switching elements, care is taken to ensure that when a selection signal is applied, either one or the other semiconductor chip is activated. The switching elements are expediently input drivers that can be turned off or deactivated. The drivers have a connection that is connected to a programmable element. A fuse or an antifuse, preferably, connected to a connection for a supply potential, serves as the programmable element. The fuse or the antifuse is programmed by an energy pulse, i.e., is put by programming from the conducting into the nonconducting state (fuse) or from the nonconducting into the conducting state (antifuse). As a result, the control signal input of the input amplifier is either connected through the conducting fuse/antifuse to the supply potential. In the case of a nonconducting fuse/antifuse, pull-up or pull-down elements provide for the connection to the other supply potential. Consequently, the setting of the input driver can be programmed to be either signal-transmissive or signal-blocking.

On the output side, the input drivers are connected to one another. At the junction connection, a signal is provided that switches the functional units of the chip on or off. Various circuit concepts are conceivable for such a purpose. By way of example, all the input or output drivers connected to the contact points are switched on or off. As such, the semiconductor chip can be activated or deactivated for an access within a chip stack.

A fuse or an antifuse can be switched to conducting or nonconducting by an energy pulse. It contains a fusible layer that, in reaction to the energy pulse, forms a conducting connection anew or breaks a conducting connection. A laser beam or a current pulse is suitable as the energy pulse.

In accordance with another feature of the invention, there are provided fusible links each having a programming state. The programmable switching elements each have a receiving circuit for an input signal. Each of the programmable switching elements is connected to at least one of the fusible links. The receiving circuit is turned off dependent upon the programming state of a fusible link respectively connected to the receiving circuit.

In accordance with a further feature of the invention, the receiving circuit has an output and the outputs of each of the receiving circuits are connected to one another.

In accordance with an added feature of the invention, each of the fusible links is irreversibly programmable by action of an energy pulse.

In accordance with an additional feature of the invention, each of the fusible links is selected from the group consisting of a fuse and an antifuse and each of the fusible links has a connection connected to a node for a supply potential.

A further object of the invention is to be seen in specifying a stack configuration including at least two such semiconductor chips.

The invention is particularly applicable to semiconductor memories to form chip stacks, so-called memory modules. A memory module includes at least two mutually corresponding memory chips disposed one above the other. The circuit according to the invention affords programmability to the effect that either one or the other semiconductor memory can be activated by the application of a selection signal. Therefore, it is possible to always use identical memory chips that can be mass-produced in order to form modules. Individual wirings are not necessary. Rather, the semiconductor memory is correspondingly programmed and can then be activated or deactivated by selection signals.

With the objects of the invention in view, there is also provided a circuit configuration, including at least two integrated semiconductor circuits, each of the at least two integrated semiconductor circuits having a substrate body having a first main area and a second main area opposite the first main area, first contact points for feeding signals to be processed, the first contact points disposed at the first main area, functional elements disposed in the substrate body, a respective one of the functional elements being connected to a respective one of the first contact points, programmable switching elements each having an output side and a programming, a respective one of the programmable switching elements either forwarding or blocking an externally fed selection signal dependent upon the programming of the respective one of the programmable switching elements, at least two second contact points each respectively connected to one of the programmable switching elements, further contact points disposed at the second main area, one of the further contact points being connected to a respective one of the first and the second contact points, at least one coupling node for conveying an internal selection signal, the output side of the programmable switching elements being coupled to the at least one coupling node and being connected to the functional elements, and the functional elements being controllable dependent upon the internal selection signal present at the at least one coupling node, and the further contact points at the second main area of a first of the at least two semiconductor circuits connected to the first contact points of the first main area of a second of the at least two semiconductor circuits.

With the objects of the invention in view, there is also provided a circuit configuration, including at least two integrated semiconductor circuits, each of the at least two integrated semiconductor circuits having a substrate body having a first main area and a second main area opposite the first main area, contact points for feeding signals to be processed, the contact points disposed at the first main area, functional elements disposed in the substrate body, a respective one of the functional elements being connected to a respective one of the contact points, further contact points disposed at the second main area, the further contact points and the contact points connected to one another, programmable switching elements each having an output side and a programming, at least two of the contact points respectively connected to one of the programmable switching elements, the programmable switching elements either forwarding or blocking an externally fed selection signal at the at least two of the contact points dependent upon the programming of the programmable switching elements, and the programmable switching elements being coupled at the output side and generating an internal selection signal at the output side, a control of the functional element being dependent upon the internal selection signal, and the further contact points at the second main area of a first of the at least two semiconductor circuits connected to the contact points of the first main area of a second of the at least two semiconductor circuits.

In accordance with yet another feature of the invention, respective ones of the programmable switching elements having the further contact points of the first circuit connected to the contact points of the second circuit are programmed differently.

In accordance with yet a further feature of the invention, the programmable switching elements each have an input side, one of the programmable switching elements in the first circuit is programmed to forward a signal fed on the input side thereof, and one of the programmable switching elements in the second circuit connected to the one element in the first circuit is programmed to block the one element in the second circuit for the signal fed on the input side of the one element in the second circuit.

In accordance with yet an added feature of the invention, in the first and second circuits, one of the programmable switching elements is respectively programmed to forward a signal fed thereto on the input side, and another of the programmable switching elements in a same one of the first and second circuits is respectively programmed to block a signal fed thereto on the input side.

In accordance with a concomitant feature of the invention, the contact points or connection pads disposed on the front side of the, e.g., lower semiconductor memory are contact-connected to the connection pads situated on the rear side of the upper semiconductor memory. The latter connection pads, in turn, are looped through to the, e.g., upper front side of the upper semiconductor memory. This means that the contact points at one main area of the memory chip are connected, by connecting lines led through the substrate body, to those on the other, opposite main area of the semiconductor chip. Suitable measures exist for this in the prior art.

In this way, all the connection pads of one semiconductor chip are connected in parallel, on the input side, with all the connection pads of the other semiconductor chip. This applies, in particular, also to the above-mentioned input drivers for the selection signals. The drivers are programmed differently within a chip, i.e., one of the drivers is programmed to be transmissive for a selection signal fed on the input side, and another driver is blocked. Comparable input drivers in different semiconductor chips are programmed differently. Therefore, the selection signal fed to first input drivers that are connected to one another is forwarded only into one semiconductor chip to activate or deactivate the functional units in that semiconductor chip, while a selection signal fed to the other input drivers that are connected to one another is fed precisely to the other semiconductor chip to activate or deactivate functional units there. The selection signal fed to one connection pad serves for activating one chip, and the selection signal fed to the other connection pad serves for activating only the other chip within the chip stack.

As such, it is possible to combine two identical chips to form a semiconductor stack and make them individually addressable merely through a respectively identical programming of fusible links (fuse/antifuse) disposed crosswise.

In a development of such a concept, it is possible to develop the input amplifiers for their part as a logic circuit that activates the associated semiconductor chip only when a binary number associated with the respective semiconductor chip is applied to the selection contact points. It is then possible to individually address a number of $2^n$ semiconductor chips in a chip stack if a number of n looped-through selection pads are connected to the logic circuit and the latter are connected in parallel with one another within the chip stack.

Other features that are considered as characteristic for the invention are set forth in the appended claims.

Although the invention is illustrated and described herein as embodied in an integrated semiconductor circuit having contact points and configuration having at least two such circuits, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
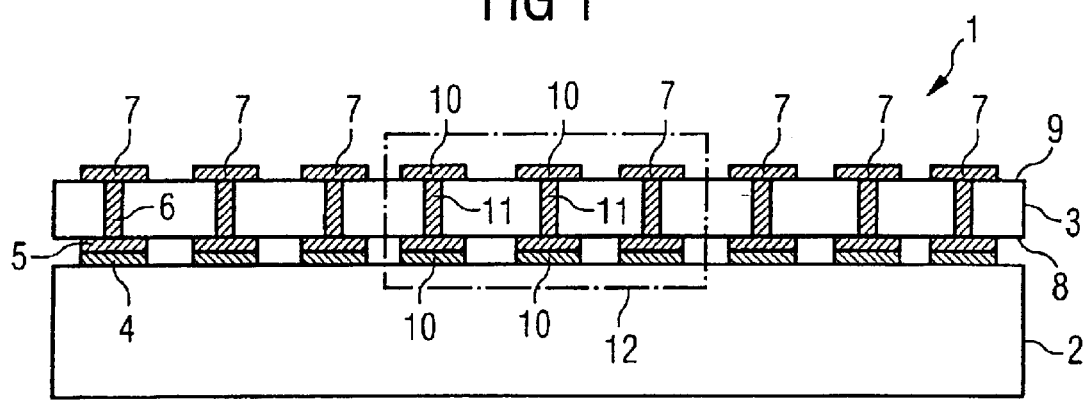
FIG. 1 is a diagrammatic cross-sectional view through a chip stack with two semiconductor chips according to the invention.

Referring now to the figures of the drawings in detail and first, particularly to FIG. 1 thereof, there is shown a chip stack including a first semiconductor chip 2, disposed at the bottom of the chip stack, and a second semiconductor chip 3, disposed above the former semiconductor chip. Both semiconductor chips 2, 3 are semiconductor memories, for example. The input and output signals and also the feeding of supply voltages are effected through respective contact points at main area of the chips. The semiconductor chip 3 has a first main area 9 at its outer side, and a second main area 8 at its rear side. The contact points are extensively formed metallization layers, so-called connection pads. Thus, the semiconductor chip 2 has a multiplicity of contact pads 4. The semiconductor chip 3 has a multiplicity of connection pads 7, 10 at its corresponding outer side 9, and a further multiplicity of contact points 5 on its rear side. On chip, respective functional units are associated with the connection pads 7, 10 to receive input signals or to output respective output signals. All the connection pads 7, 10 disposed on the outer side 9 of the semiconductor chip 3 are assigned respectively corresponding connection pads 5 on the rear side 8 of the semiconductor chip 3. Mutually assigned connection pads, for example, the pads 7, 5 illustrated on the outside left, are in each case electrically conductively connected to one another through plated-through holes. Thus, a connecting line 6 led through the semiconductor body 3 is formed between the pads 7, 5. The term employed here is a via that penetrates perpendicularly through the layer sequence of the semiconductor body. Suitable measures sufficiently exist in the prior art for fabricating the via 6. Located opposite to the configuration of the connection pads 7, 10 on the outer side 9 of the semiconductor chip 3 is a corresponding identically configured configuration of connection pads 5 on the rear side 8. The front- and rear-side connection pads are connected to one another. The semiconductor chip 2 has the same structural layout as the semiconductor chip 3, so that its connection pads 4 disposed at the surface also have the same pattern as the connection pads 7, 10 on the top side 9 of the upper semiconductor chip 3. All the inputs and outputs of the two chips 2, 3 are connected in parallel by the connection of the rear-side connection pads of the chip 3 to the front-side connection pads of the chip 2.

Figure 2:
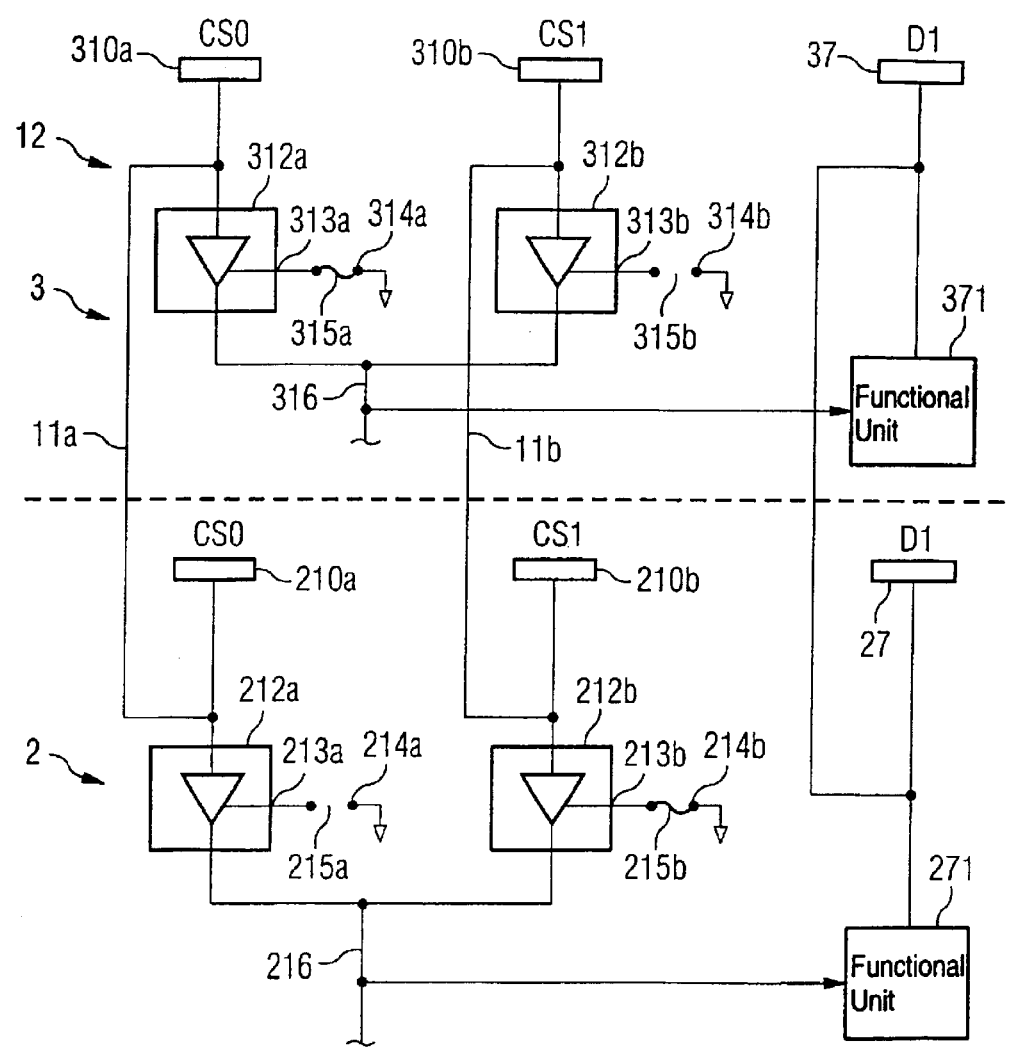
FIG. 2 is a schematic and block circuit diagram of a detail of the chip stack of FIG. 1.

The connection pads designated by 10 serve for feeding in a respective selection signal. The detail from the module configuration illustrated in FIG. 1 that is enclosed by the broken line 12 is represented in detail in FIG. 2 with an equivalent electrical circuit diagram. The upper semiconductor chip 3 has a connection pad 310*a* and a connection pad 310*b*. The connection pads lead to a respective switchable input driver or amplifier 312*a* and 312*b*. Each of the drivers 312*a*, 312*b* has a control connection 313*a*, 313*b* for an activation signal. Fusible links are connected to the control connections 313*a*, 313*b* and connect the control connection to a connection for ground potential 314*a*, 314*b* in the initial state. The fusible link 315*a* is still intact and conductively connects the connection 314*a* to the connection 313*a*. The fusible link 315*b* has been severed by a laser pulse, for example, and is nonconducting. The input driver 312*a*, 312*b* is activated or deactivated depending on the logic signal level present at the control connection 313*a*, 313*b*. The drivers are embodied, for example, such that the driver 312*a* is transmissive for an input signal CS0 present at the connection pad 310*a*, while the driver 312*b* is blocked or at high impedance for the input signal CS1. On the output side, the two drivers 312*a*, 312*b* are connected to one another and form a connection or node 316. The connection 316 carries an internal selection signal by which the semiconductor chip 3 can be selected. By way of example, an input circuit or functional unit 371 connected to the connection pad 37 is activated by the internal selection signal that is fed in at the pad 310*a* and is present at the connection 316.

The semiconductor chip 2 is constructed correspondingly. Mutually corresponding connection pads are connected to one another by respective lines 11a and 11b, which are comparable to the vias 6 illustrated in FIG. 1. Thus, the connection pad 310a is connected to the connection pad 210a through the line 11a. In a corresponding manner, the connection pads 310b and 210b are connected to one another by the connection line 11b, embodied as a via. Consequently, on the input side, all the input drivers associated with the connection pads are connected in parallel. Consequently, the same selection signals CS0 and CS1, respectively, are also fed to them in parallel. In practice, the upper chip 3 is thinned relative to the lower chip 2 by grinding. Otherwise, identically prefabricated chips have been used.

In contrast to the semiconductor chip 3, however, the semiconductor chip 2 has a different programming of its fusible links. The fuse 215a associated with the input driver 212a has been severed, while the fuse 215b associated with the other input driver 212b is still conducting, as originally. The programming of the programmable elements 215a, 215b of the semiconductor chip 2 is, therefore, complementary to the programming of the corresponding elements 315a, 315b of the semiconductor chip 3. The programmable elements are respectively programmed identically, crosswise as it were.

Such a configuration results in a function of the circuit described in the following text. Because, in the semiconductor chip 3, the input driver 312a is switched to be transmissive, while the other input driver 312b is programmed to be blocked, the semiconductor chip 3 is selected by the application of an activation level of the activation signal CS0, which is forwarded through the connection 316 to the functional unit 371 illustrated in a representative fashion. In parallel, the selection signal CS0 is fed through the connection pad 210a to the input driver 212a as well. The latter, however, is turned off by virtue of the fuse 315a that is programmed to be nonconducting so that an activation level of the selection signal CS0 does not activate the functional unit 271. The conditions with regard to the selection signal CS1 are correspondingly reversed. The selection signal CS1 is blocked by the input driver 312b and not forwarded to the node 316. Instead, the selection signal CS1 fed in parallel to the connection pad 210b in the semiconductor chip 2 is forwarded through the driver 212b to the node 216 so that the functional unit 271 in the semiconductor chip 2 can be activated. What is achieved by the crosswise programming of the fuses 315a, 315b, 215a, 215b is that either the upper semiconductor chip 3 or the lower semiconductor chip 2 can be selected and alternatively activated by two selection signals CS0, CS1. In principle, it is possible to use identically produced chips 2, 3 that are only programmed differently. The invention is, therefore, particularly suitable for stacking mass-produced integrated circuits, in particular, for stacking semiconductor memories for the formation of memory modules.

Only two semiconductor chips 2, 3 are stacked one above the other in the exemplary embodiment. It shall be noted that a plurality of semiconductor chips, generally n semiconductor chips, can also be stacked one above the other. It is expedient for such a case to provide a plurality of selection pads comparable to the pads 310a, 310b and to loop them through all of the plurality of semiconductor chips and connect them in parallel with one another by vias. In a modified exemplary embodiment, the input drivers 312a, 312b can be provided with additional logic that activates the associated semiconductor chip only when a binary number associated with the respective semiconductor chip is applied to the selection pads, which number can be programmed by the respective fuses. In the general case, $2^n$ semiconductor chips can be stacked, if n is the number of connection pads provided for the selection signals.

I claim:

1. An integrated semiconductor circuit, comprising:
   a substrate body having a first main area and a second main area opposite said first main area;
   first contact points for feeding signals to be processed, said first contact points disposed at said first main area;
   functional elements disposed in said substrate body, a respective one of said functional elements being connected to a respective one of said first contact points;
   programmable switching elements each having an output side and a programming, a respective one of said programmable switching elements either forwarding or blocking an externally fed selection signal dependent upon said programming of said respective one of said programmable switching elements;
   at least two second contact points each respectively connected to one of said programmable switching elements;
   further contact points disposed at said second main area, one of said further contact points being connected to a respective one of said first and said second contact points;
   at least one coupling node for conveying an internal selection signal;
   said output side of said programmable switching elements being coupled to said at least one coupling node and being connected to said functional elements; and
   said functional elements being controllable dependent upon said internal selection signal present at said at least one coupling node.

2. The integrated semiconductor circuit according to claim 1, including:
   fusible links each having a programming state;
   said programmable switching elements each having a receiving circuit for an input signal, each of said programmable switching elements connected to at least one of said fusible links; and
   said receiving circuit being turned off dependent upon said programming state of a fusible link respectively connected to said receiving circuit.

3. The integrated semiconductor circuit according to claim 2, wherein:
   said receiving circuit has an output; and
   said output of each of said receiving circuits are connected to one another.

4. The integrated semiconductor circuit according to claim 2, wherein each of said fusible links is irreversibly programmable by action of an energy pulse.

5. The integrated semiconductor circuit according to claim 4, wherein each of said fusible links is selected from the group consisting of a fuse and an antifuse and each of said fusible links has a connection connected to a node for a supply potential.

6. The integrated semiconductor circuit according to claim 2, wherein each of said fusible links is selected from the group consisting of a fuse and an antifuse and each of said fusible links has a connection connected to a node for a supply potential.

7. An integrated semiconductor circuit, comprising:
   a substrate body having a first main area and a second main area opposite said first main area;
   contact points for feeding signals to be processed, said contact points disposed at said first main area;

functional elements disposed in said substrate body, a respective one of said functional elements being connected to a respective one of said contact points;

further contact points disposed at said second main area, said further contact points and said contact points connected to one another;

programmable switching elements each having an output side and a programming;

at least two of said contact points respectively connected to one of said programmable switching elements;

said programmable switching elements either forwarding or blocking an externally fed selection signal at said at least two of said contact points dependent upon said programming of said programmable switching elements; and said programmable switching elements being coupled at said output side and generating an internal selection signal at said output side, a control of said functional element being dependent upon said internal selection signal.

8. The integrated semiconductor circuit according to claim 7, including:

fusible links each having a programming state;

said programmable switching elements each having a receiving circuit for an input signal, each of said programmable switching elements connected to at least one of said fusible links; and said receiving circuit being turned off dependent upon said programming state of a fusible link respectively connected to said receiving circuit.

9. The integrated semiconductor circuit according to claim 8, wherein:

said receiving circuit has an output; and said output of each of said receiving circuits are connected to one another.

10. The integrated semiconductor circuit according to claim 8, wherein each of said fusible links is irreversibly programmable by action of an energy pulse.

11. The integrated semiconductor circuit according to claim 10, wherein each of said fusible links is selected from the group consisting of a fuse and an antifuse and each of said fusible links has a connection connected to a node for a supply potential.

12. The integrated semiconductor circuit according to claim 8, wherein each of said fusible links is selected from the group consisting of a fuse and an antifuse and each of said fusible links has a connection connected to a node for a supply potential.

13. A circuit configuration, comprising:

at least two integrated semiconductor circuits, each of said at least two integrated semiconductor circuits having:

a substrate body having a first main area and a second main area opposite said first main area;

first contact points for feeding signals to be processed, said first contact points disposed at said first main area;

functional elements disposed in said substrate body, a respective one of said functional elements being connected to a respective one of said first contact points;

programmable switching elements each having an output side and a programming, a respective one of said programmable switching elements either forwarding or blocking an externally fed selection signal dependent upon said programming of said respective one of said programmable switching elements;

at least two second contact points each respectively connected to one of said programmable switching elements;

further contact points disposed at said second main area, one of said further contact points being connected to a respective one of said first and said second contact points;

at least one coupling node for conveying an internal selection signal;

said output side of said programmable switching elements being coupled to said at least one coupling node and being connected to said functional elements; and said functional elements being controllable dependent upon said internal selection signal present at said at least one coupling node; and said further contact points at said second main area of a first of said at least two semiconductor circuits connected to said first contact points of said first main area of a second of said at least two semiconductor circuits.

14. The configuration according to claim 13, wherein respective ones of said programmable switching elements having said further contact points of said first circuit connected to said contact points of said second circuit are programmed differently.

15. The configuration according to claim 14, wherein:

said programmable switching elements each have an input side;

one of said programmable switching elements in said first circuit is programmed to forward a signal fed on said input side thereof; and one of said programmable switching elements in said second circuit connected to said one element in said first circuit is programmed to block said one element in said second circuit for said signal fed on said input side of said one element in said second circuit.

16. The configuration according to claim 15, wherein, in said first and second circuits:

one of said programmable switching elements is respectively programmed to forward a signal fed thereto on said input side, and another of said programmable switching elements in a same one of said first and second circuits is respectively programmed to block a signal fed thereto on said input side.

17. A circuit configuration, comprising:

at least two integrated semiconductor circuits, each of said at least two integrated semiconductor circuits having:

a substrate body having a first main area and a second main area opposite said first main area;

contact points for feeding signals to be processed, said contact points disposed at said first main area;

functional elements disposed in said substrate body, a respective one of said functional elements being connected to a respective one of said contact points;

further contact points disposed at said second main area, said further contact points and said contact points connected to one another;

programmable switching elements each having an output side and a programming;

at least two of said contact points respectively connected to one of said programmable switching elements;

said programmable switching elements either forwarding or blocking an externally fed selection signal at said at least two of said contact points dependent upon said programming of said programmable switching elements; and said programmable switching elements being coupled at said output side and generating an internal selection signal at said output side, a control of said functional element being dependent upon said internal selection signal; and said further contact points at said second main area of a first of said at least two semiconductor circuits connected to said contact points of said first main area of a second of said at least two semiconductor circuits.

18. The configuration according to claim 17, wherein respective ones of said programmable switching elements having said further contact points of said first circuit connected to said contact points of said second circuit are programmed differently.

19. The configuration according to claim 18, wherein:

said programmable switching elements each have an input side;

one of said programmable switching elements in said first circuit is programmed to forward a signal fed on said input side thereof; and one of said programmable switching elements in said second circuit connected to said one element in said first circuit is programmed to block said one element in said second circuit for said signal fed on said input side of said one element in said second circuit.

20. The configuration according to claim 19, wherein, in said first and second circuits:

one of said programmable switching elements is respectively programmed to forward a signal fed thereto on said input side, and another of said programmable switching elements in a same one of said first and second circuits is respectively programmed to block a signal fed thereto on said input side.

* * * * *